(12) United States Patent
Schoen et al.

(10) Patent No.: US 6,362,495 B1
(45) Date of Patent: Mar. 26, 2002

(54) DUAL-METAL-TRENCH SILICON CARBIDE SCHOTTKY PINCH RECTIFIER

(75) Inventors: Kipp J. Schoen, Fort Collins, CO (US); Jason P. Henning, Lafayette, IN (US); Jerry M. Woodall, New Haven, CT (US); James A. Cooper, Jr.; Michael R. Melloch, both of West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 09/264,156

(22) Filed: Mar. 5, 1999

Related U.S. Application Data
(60) Provisional application No. 60/076,847, filed on Mar. 5, 1998.

(51) Int. Cl.[7] ............................................. H01L 31/0312
(52) U.S. Cl. ........................ 257/77; 257/471; 257/485; 438/570; 438/582
(58) Field of Search ...................... 257/77, 471, 485, 257/486; 438/570, 582

(56) References Cited

U.S. PATENT DOCUMENTS

| | | | |
|---|---|---|---|
| 4,641,174 A | 2/1987 | Baliga | 357/58 |
| 4,646,115 A | 2/1987 | Shannon et al. | 357/15 |
| 4,982,260 A | 1/1991 | Chang et al. | 357/38 |
| 5,017,976 A | 5/1991 | Sugita | 357/15 |
| 5,061,972 A | 10/1991 | Edmond | 357/13 |
| 5,072,266 A | 12/1991 | Bulucea et al. | 357/23.4 |
| 5,241,195 A | 8/1993 | Tu et al. | 257/155 |
| 5,262,668 A | 11/1993 | Tu et al. | 257/475 |
| 5,506,421 A | 4/1996 | Palmour | 257/77 |
| 5,612,232 A * | 3/1997 | Thero et al. | 437/39 |
| 5,612,567 A | 3/1997 | Baliga | 257/457 |
| 5,719,409 A | 2/1998 | Singh et al. | 257/77 |
| 5,789,311 A | 8/1998 | Ueno et al. | 438/573 |
| 6,078,090 A * | 6/2000 | Williams et al. | 257/476 |

OTHER PUBLICATIONS

Baliga, B.J. The Pinch Rectifier: A Low–Forward–Drop High–Speed Power Diode, IEEE Electron Device Letters, vol. Edl–5, No. 6, Jun. 1984.

Kunori, S., Ishida, J., Tanaka, M., Wakatabe, M., Kan, T. The Low Power Dissipation Schottky Barrier Diode with Trench Structure, Proceedings of 1992 International Symposium on Power Semiconductor Devices & ICs, Tokyo, pp. 66–71.

Mehrotra, Manoj and Baliga, B. Jayant, Trench MOS Barrier Schottky (TMBS) Rectifier: A Schottky Rectifier with Higher Than Parallel Plane Breakdown Voltage, Solid–State Electronics, vol. 38, No. 4, pp. 806–806, 1995.

Baliga, B. Jayant, *Power Semiconductor Devices*, pp. 128–197, 410–420, 1995.

Schoen, K.J. Henning, J.P., Woodall, J.M., Cooper, J.A., Jr., Melloch, M.R., A Dual–Metal–Trench Schottky Pinch–Rectifier in 4H SiC, International Conference on Silicon Carbide & III–N, 1997.

(List continued on next page.)

Primary Examiner—Sara Crane
(74) Attorney, Agent, or Firm—Woodard, Emhardt, Naughton, Moriarty & McNett

(57) ABSTRACT

A dual-metal-trench silicon carbide Schottky pinch rectifier having a plurality of trenches formed in an n-type SiC substrate, with a Schottky contact having a relatively low barrier height on a mesa defined between adjacent ones of the trenches, and a Schottky contact having a relatively high barrier height at the bottom of each trench. The same metal used for the Schottky contact in each trench is deposited over the Schottky contact on the mesa. A simplified fabrication process is disclosed in which the high barrier height metal is deposited over the low barrier height metal and then used as an etch mask for reactive ion etching of the trenches to produce a self-aligned low barrier contact.

10 Claims, 9 Drawing Sheets

OTHER PUBLICATIONS

M. Bhatnagar, P.K. McLarty, B.J. Baliga, "Silicon–Carbide High–Voltage (400 V) Schottky Barrier Diodes," IEEE Electron Devices Letters, vol. 13, No. 10, Oct. 1992, pp. 501–503.

M. Bhatnagar, B.J. Baliga, H.R. Kirk, G.A. Rozgonyi, "Effect of Surface Inhomogeneties on the Electrical Characteristics of SiC Schottky Contacts," IEEE Transactions on Electron Devices, vol. 43, No. 1, Jan. 1996, pp. 150–156.

A. Itoh, T. Kimoto, H. Matsunami, "Excellent Reverse Blocking Characteristics of High–Voltage 4H–SiC Schottky Rectifiers with Boron–Implanted Edge Termination," IEEE Transactions on Electron Devices, vol. 17, No. 3, Mar. 1996, pp. 139–141.

B.J. Baliga, "Trends in Power Semiconductor Devices," IEEE Transactions on Electron Devices, vol. 43, No. 10, Oct. 1996, pp. 1717–1731.

K.J. Schoen, E.S. Harmon, J.M. Woodall, T.P. Chin, "High Voltage GaInP/GaAs Dual–Material Schottky Rectifiers," Appl. Phy. Lett. vol. 71, No. 4, Jul. 1997, pp. 518–520.

K.J. Schoen, J.M. Woodall, J.A. Cooper, M.R. Melloch, "Design Considerations and Experimental Analysis of High-Voltage SiC Schottky Barrier Rectifiers," IEEE Transactions on Electron Devices, vol. 45, No. 7, Jul. 1998, pp. 1595–1604.

\* cited by examiner

- Nickel
- Titanium
- Gold
- Metal Contact

DUAL-METAL-TRENCH SILICON CARBIDE SCHOTTKY PINCH RECTIFIER

CROSS-REFERENCE TO RELATED APPLICATION

This application claims the benefit of U.S. Provisional Application No. 60/076,847, filed Mar. 5, 1998, which is hereby incorporated herein in its entirety by reference.

GOVERNMENT RIGHTS

This invention was made with government support under Grant No. N00014-95-1-1302 awarded by the Department of Navy Research. The government has certain rights in the invention.

BACKGROUND OF THE INVENTION

This invention relates to power semiconductor devices, and more particularly to Schottky barrier rectifiers.

Schottky barrier rectifiers are used extensively as output rectifiers in switching-mode power supplies and in other high-speed power switching applications, such as motor controls, for carrying large forward currents and supporting large reverse blocking voltages. As is well known to those having skill in the art, rectifiers exhibit low resistance to current flow in a forward direction and a very high resistance to current flow in a reverse direction. As is also well known to those having skill in the art, a Schottky barrier rectifier produces rectification as a result of nonlinear unipolar current transport across a metal semiconductor contact. A detailed discussion of the design of Schottky barrier power rectifiers may be found in Chapter 4 of a textbook by B. J. Baliga entitled "Power Semiconductor Devices," PWS Publishing Co. (1995), the disclosure of which is hereby incorporated herein by reference.

SiC Schottky rectifiers are a promising technology since they offer the potential for a low forward voltage drop, high breakdown voltage, and fast switching speed with no reverse recovery current, as discussed in the following papers which are hereby incorporated by reference: M. Bhatnagar et al., "Silicon-Carbide High-Voltage (400 V) Schottky Barrier Diodes," IEEE Electron Device Letters, Vol. 13, No. 10, October 1992, pp. 501–503; and A. Itoh et al, "Excellent Reverse Blocking Characteristics of High-Voltage 4H—SiC Schottky Rectifiers with Boron-Implanted Edge Termination," IEEE Electron Device Letters, Vol. 17, No. 3, March 1996, pp. 139–141. However, the design of a power Schottky rectifier requires a tradeoff in selecting the optimal Schottky metal. The power dissipated by a Schottky rectifier depends on the forward voltage drop and the reverse leakage current, both of which should be as low as possible, and both of which are related to the Schottky barrier height, i.e., the magnitude of the potential barrier between the metal and semiconductor regions of a Schottky contact. A small barrier height metal will have a low forward voltage drop and a large reverse leakage current. Conversely, a large barrier height metal will have a larger forward voltage drop and a smaller reverse leakage current. Therefore, it is desirable to have a Schottky rectifier which exhibits the forward characteristics of a small barrier height metal and the reverse characteristics of a large barrier height metal. These conflicting design criteria have heretofore not been met in materials such as SiC. The problem of conflicting design criteria is compounded by the fact that SiC Schottky rectifier reverse leakage currents have been observed to be larger than predicted by thermionic emission theory. See, e.g., M. Bhatnagar et al., "Effect of Surface Inhomogeneities on the Electrical Characteristics of SiC Schottky Contacts," IEEE Transactions on Electron Devices, Vol. 43, No. 1, January 1996, pp. 150–156, which paper is hereby incorporated by reference.

One proposed solution to the problem is to use a "pinch" Schottky rectifier. A pinch Schottky rectifier utilizes a high barrier region to pinch-off or electrically shield a low barrier region. Many different designs of pinch rectifiers have been implemented in Si, including implanted/diffused P-N junction pinch rectifiers (junction barrier Schottky (JBS) rectifiers), trench-JBS (TJBS) rectifiers, and trench-MOS barrier-Schottky (TMBS) pinch rectifiers, discussed respectively in the following papers which are hereby incorporated by reference: B. J. Baliga, "The Pinch Rectifier: A Low-Forward-Drop High-Speed Power Diode," IEEE Electron Device Letters, Vol. 5, No. 6, June 1984, pp. 194–196; S. Kunori et al., "The Lower Power Dissipation Schottky Barrier Diode with Trench Structure," Proceedings of 1992 International Symposium on Power Semiconductor Devices & ICs, Tokyo, pp. 66–71; and M. Mehrotra et al., "Trench MOS Barrier Schottky (TMBS) Rectifier: A Schottky Rectifier with Higher than Parallel Plane Breakdown Voltage," Solid-State Electronics, Vol. 38, No. 4, 1995, pp. 801–806. In a paper by B. J. Baliga entitled "Trends in Power Semiconductor Devices" and published in IEEE Transactions on Electron Devices, Vol. 43, No. 10, October 1996, pp. 1717–1731, which paper is hereby incorporated by reference, JBS and TMBS rectifiers have been recognized as evolutionary improvements to the planar power Schottky rectifier device structure.

The implementation of a JBS or TJBS in SiC is somewhat difficult due to the lack of diffusion of dopant impurities in SiC. In addition, due to the large critical field of SiC, the usefulness of a SiC TMBS would be somewhat limited by oxide breakdown.

It has also been proposed to achieve a more favorable tradeoff between forward voltage drop and reverse leakage current by providing regions of different barrier heights in a Schottky barrier rectifier. U.S. Pat. No. 5,262,668 to Tu et al. discloses such a device implemented in silicon. There is no apparent recognition of the limited benefits obtained with a silicon substrate and no suggestion that SiC would be preferable as a substrate material for any reason.

Despite all the developments in the state of the art, there remains a need for improvements in SiC Schottky barrier rectifiers over known devices in terms of low forward voltage drop and low reverse leakage current, resulting in a significant reduction in total power dissipation.

SUMMARY OF THE INVENTION

The present invention meets this need and others with a dual-metal-trench (DMT) SiC Schottky pinch rectifier. The device has a plurality of trenches formed in a SiC substrate of a first conductivity type, and includes a first Schottky contact at the bottom of each trench and a second Schottky contact on each mesa between adjacent ones of the trenches. The first Schottky contact has a relatively high barrier height, and the second Schottky contact has a relatively low barrier height.

Another aspect of the present invention is a simplified method of fabricating a SiC Schottky rectifier. The method includes the following steps: forming a bi-layer metal pattern, forming a bi-layer metal pattern on a silicon carbide substrate, the bi-layer metal pattern including a lower layer in contact with the silicon carbide substrate and an upper layer having the same length and width as the lower layer, wherein the lower layer is a metal having a relatively low barrier height and the upper layer is suitable as an etch mask; forming a pattern of trenches in the silicon carbide substrate by reactive ion etching with the upper layer of the bi-layer metal pattern as an etch mask, whereby the lower layer metal is self-aligned to the trenches; forming a metal layer in the trenches; and forming an ohmic contact on the bottom surface of the substrate.

It is a general object of the present invention to provide improvements in the performance of power SiC Schottky rectifiers.

A more specific object of the invention is to provide a SiC Schottky rectifier having forward bias characteristics similar to those of a SiC Schottky rectifier with a low barrier height, and reverse bias characteristics similar to those of a SiC Schottky rectifier with a high barrier height.

A further object of the present invention is to provide a relatively simple process of fabricating a SiC Schottky rectifier.

These and other objects and advantages of the present invention will be more apparent upon reading the following detailed description of the preferred embodiment in conjunction with the accompanying drawings.

DETAILED DESCRIPTION OF THE PREFERRED EMBODIMENT

Figure 1:
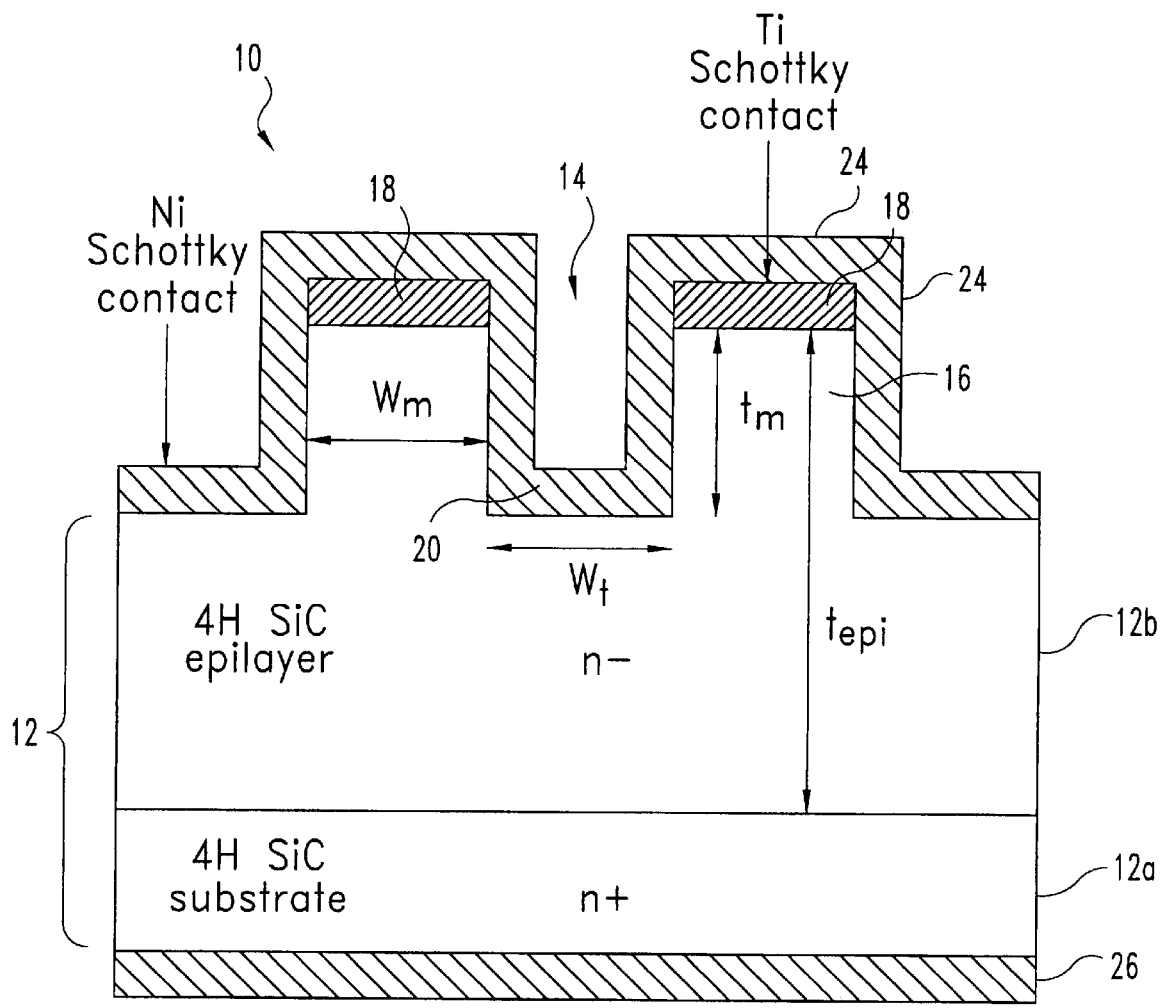
FIG. 1 is a cross-sectional view of the preferred embodiment of a dual-metal trench (DMT) SiC Schottky pinch rectifier according to the present invention.

For the purpose of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

A preferred embodiment of a SiC Schottky pinch rectifier 10 according to the present invention is shown in FIG. 1. 4H SiC is the preferred material for the substrate 12, which includes a relatively heavily doped base layer 12a of a first conductivity type, e.g., n-type, and an epitaxial layer 12b of thickness $t_{epi}$ of the same conductivity type. A plurality of trenches 14 of width $w_t$ are formed in the epilayer 12b which thereby defines a mesa 16 of width $w_m$ and thickness $t_m$ between adjacent ones of the trenches as shown in the drawing. A Schottky contact 18 is formed on each mesa with a metal such as titanium (Ti) having a low Schottky barrier height ($\phi_{bn}$), and a Schottky contact 20 is formed at the bottom of each trench with a metal such as nickel (Ni) having a low Schottky barrier height. Layers 22 and 24 of nickel are also formed on the trench walls and on Ti contact 18, respectively. The device also includes a large-area backside contact 26.

Figure 2A:
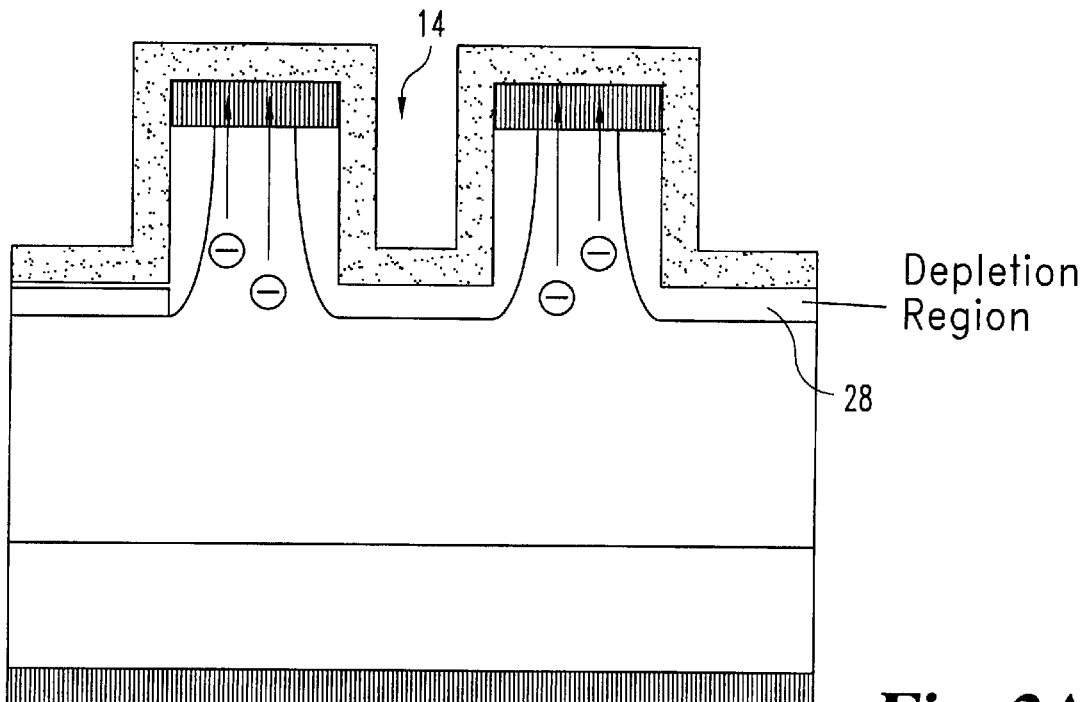
FIGS. 2A and 2B are cross-sectional views of the rectifier of FIG. 1 illustrating conditions during forward and reverse bias, respectively.
Figure 2B:
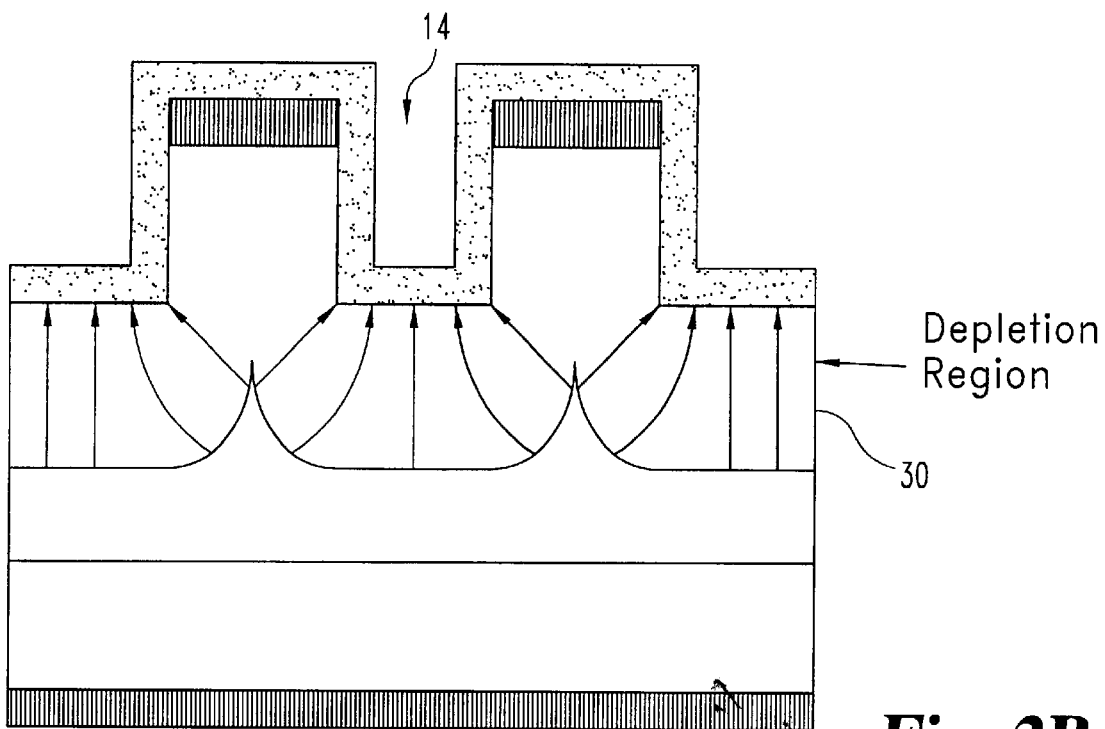

Under forward bias, the Ti contact is forward biased and dominates the current flow through the device. A relatively narrow depletion region 28 is formed in the epilayer below each trench and along the trench walls, as illustrated in FIG. 2A. Under reverse-bias, the Ni contact pinches off the mesa region and the electric field at the Ti contact is pinned to a low value. The reverse bias condition, including a relatively large depletion region 30, is shown in FIG. 2B. The effect is to electrically shield the Ti contact from further increases in voltage and restrict high electric fields to the large barrier height Schottky contact, thereby enabling the device to exhibit reverse characteristics determined by the large barrier height metal.

Figure 3B:
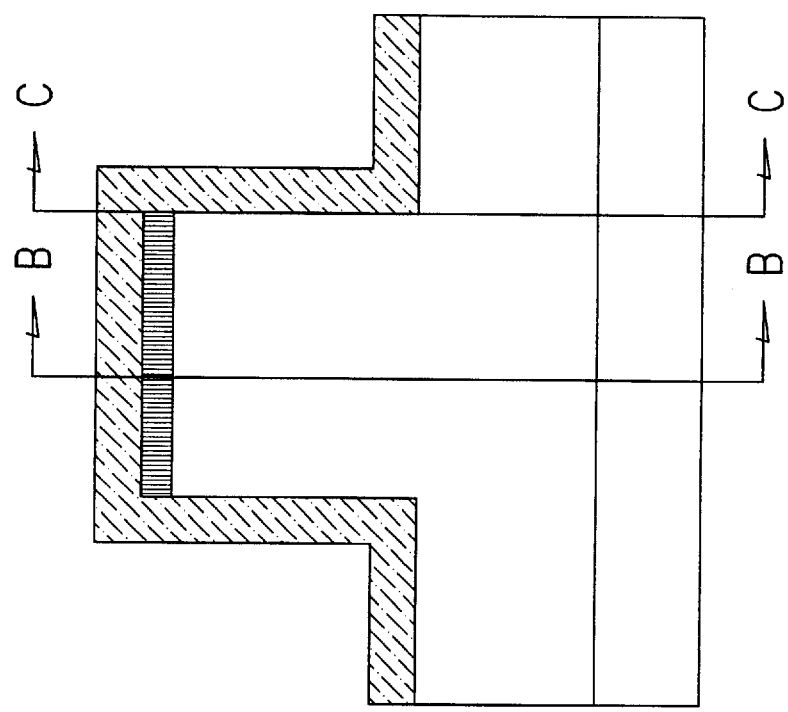
FIGS. 3A and 3B are respective cross-sectional views of a planar Schottky diode and a DMT SiC Schottky diode according to the present invention.
Figure 3A:
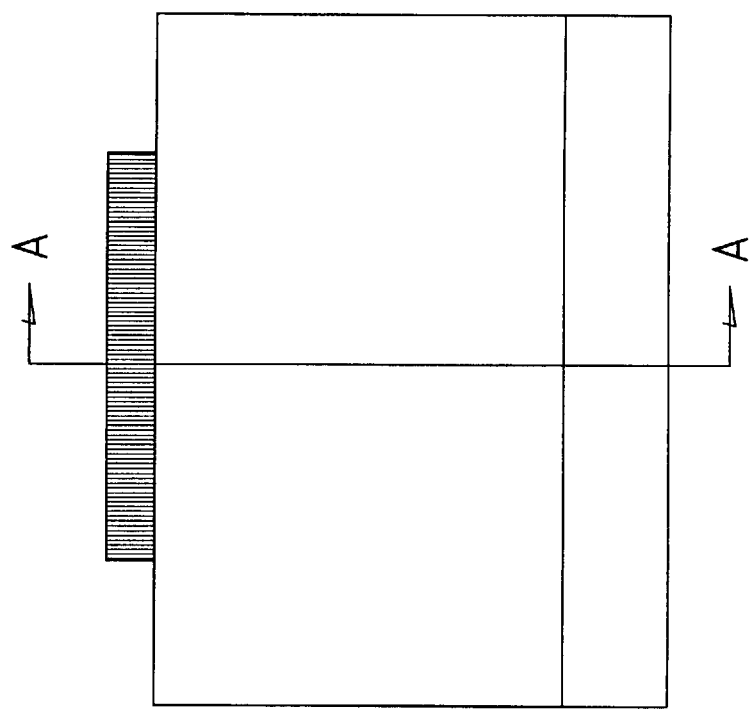
Figure 4A:
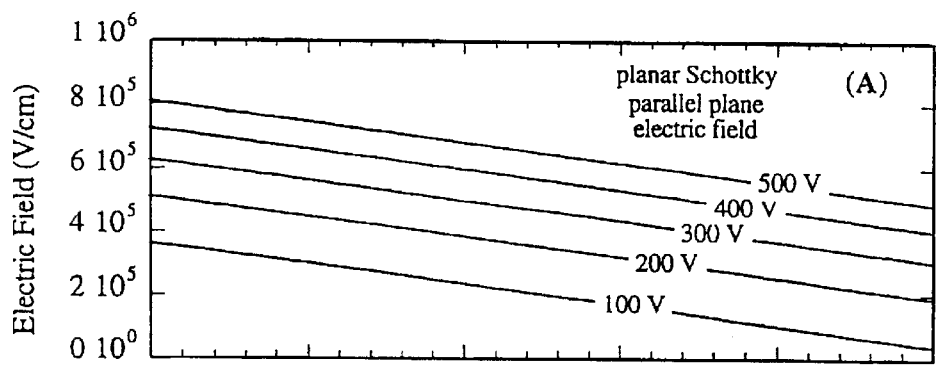
FIGS. 4A, 4B, and 4C are respective plots of electric field strength versus depth into the epitaxial layer along the following lines: line A through the center of a planar Schottky diode, line B through the mesa center of a DMT SiC Schottky rectifier according to the present invention, and line C along the trench edge of a DMT SiC Schottky rectifier according to the present invention.
Figure 4B:
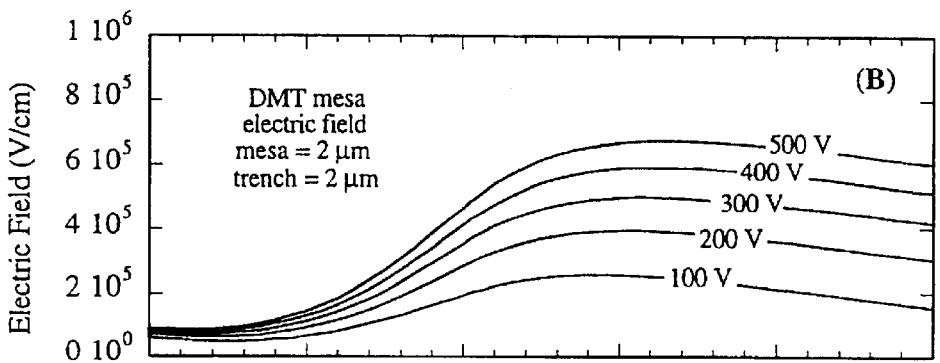
Figure 4C:
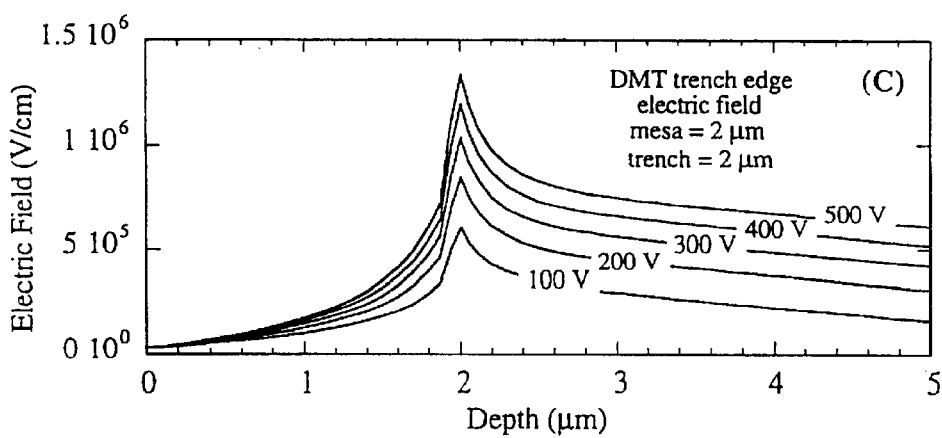

Two-dimensional MEDICI simulations (with $w_m=w_t=t_m=2$ μm) have been used to verify the mesa pinch-off and electrical field pinning of the Ti interface. With reference to FIGS. 3 and 4, the simulation results plotted in FIGS. 4A and 4B, representing the electric fields along lines A and B of FIGS. 3A and 3B, respectively, show that the mesa or Ti interface electric field is pinned to a low value compared to the electric field of a planar contact of a Ti/SiC diode. A tradeoff of this design is the field crowding at the trench corner which causes a premature increase in reverse leakage current of the Ni contact and reduces the breakdown voltage. FIG. 4C shows the electric field at the edge of the trench, with the corner being at a depth of 2 μm. It is believed that the field crowding at the trench corner may be partially mitigated by etching the bottom of the trenches and rounding the trench corners.

Figure 5A:
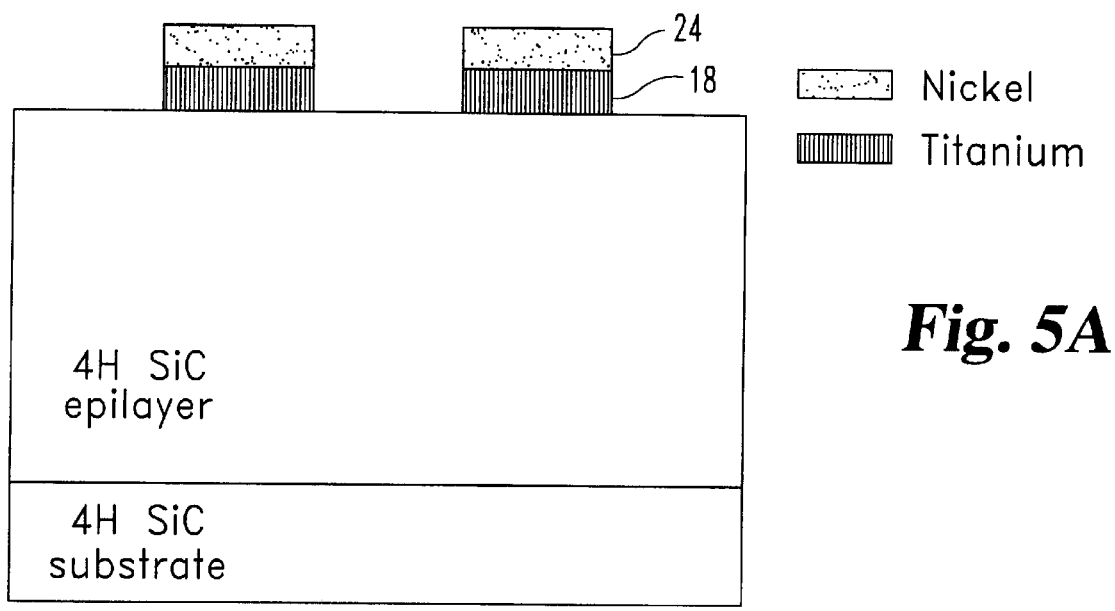
FIGS. 5A–E are cross-sectional views of the preferred embodiment of a DMT SiC Schottky rectifier according to the present invention at various steps during fabrication thereof.
Figure 5B:
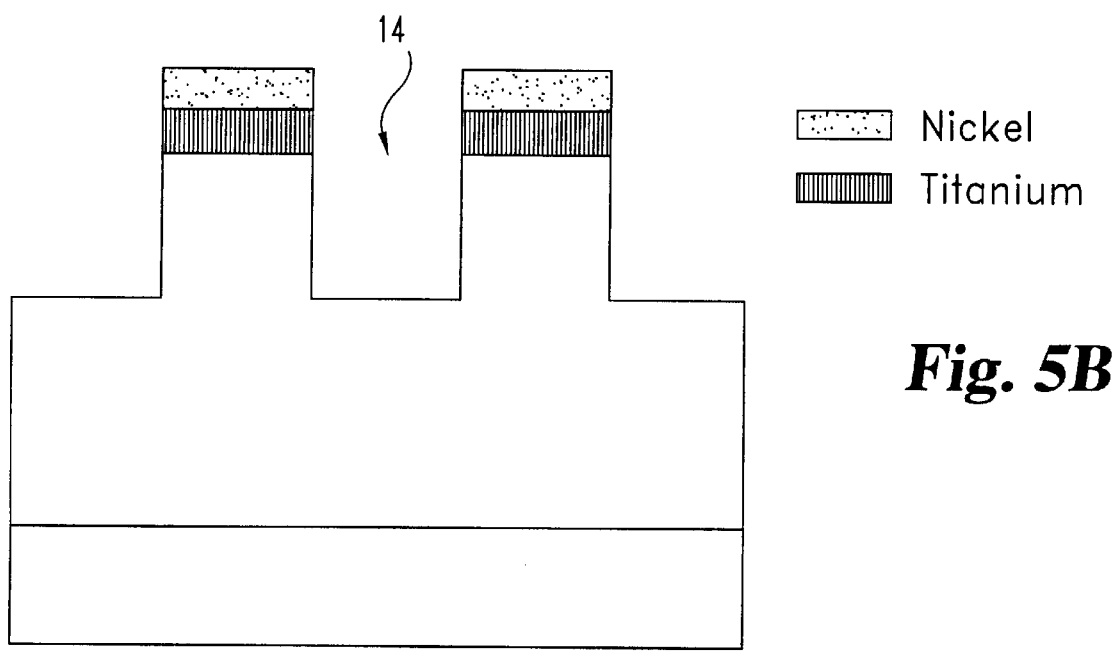
Figure 5C:
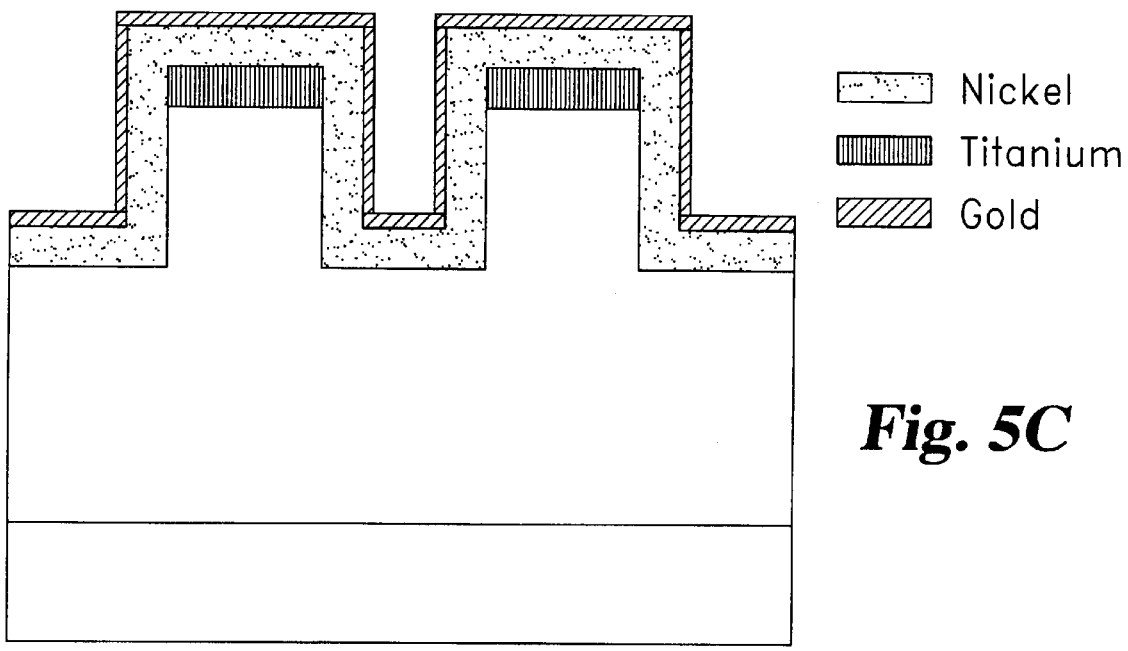
Figure 5D:
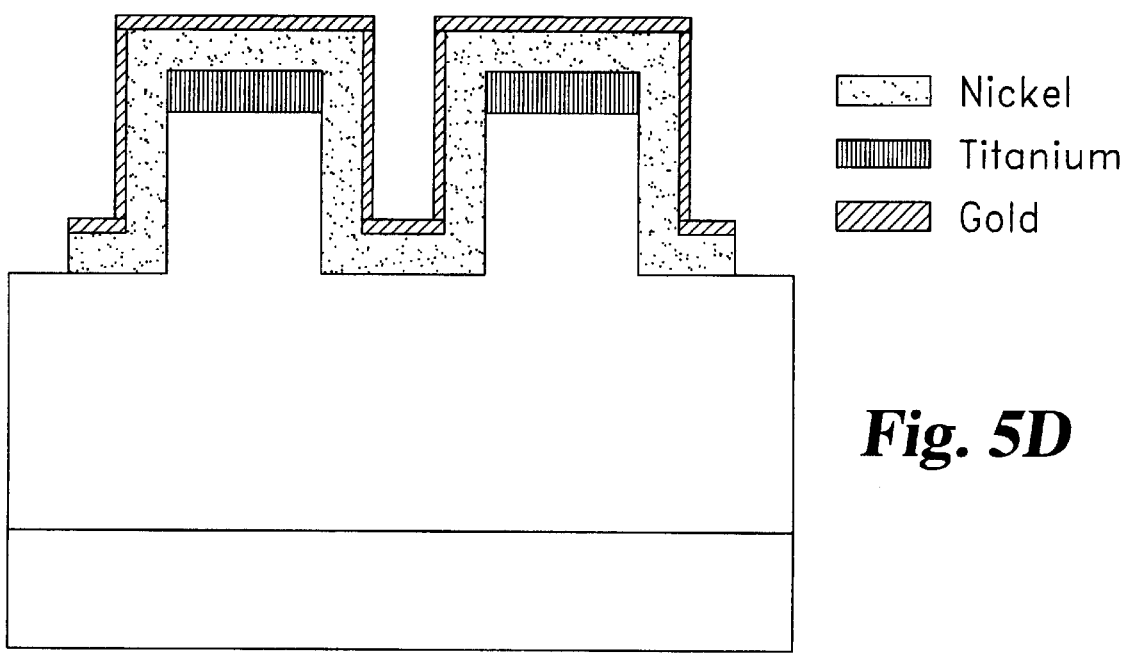
Figure 5E:
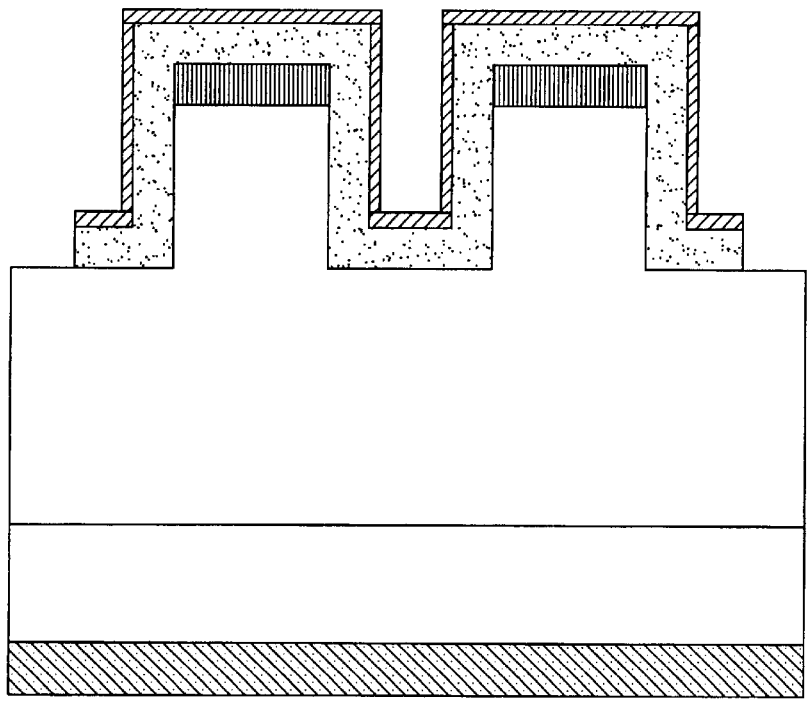

The preferred process of fabrication will now be described with reference to FIG. 5, which shows the device at various steps in the fabrication thereof. Ti/Ni DMT Schottky rectifiers were fabricated on an n-type 4H Si-face SiC sample obtained from Cree Research, Inc., Durham, N.C. The sample had an epilayer with doping of $3 \times 10^{15}$ cm$^{-3}$ and with a thickness ($t_{epi}$) of 13 μm. The devices were fabricated using electron-beam lithography and liftoff to define linear patterns of Ti/Ni stripes. The Ti/Ni metals are deposited by electron-beam evaporation in a single run in which Ti is evaporated onto the mesa and then the material source is switched such that Ni is evaporated over the Ti. This step in the fabrication process is depicted in FIG. 5A. Nickel is preferred for the upper layer because it is useful as an etch mask for reactive ion etching (RIE). Sufficient nickel is deposited to enable it to act as an etch mask, i.e., at least 1000 Angstroms to etch 2 μm in SiC. It is noted in this regard that nickel etches at approximately ¹⁄₂₀ the rate of SiC during RIE. Devices were fabricated with $w_m$ and $w_t$ equal and either 2 µm or 3 µm. Referring now to FIG. 5B, the epilayer was etched by RIE in $SF_6$ to a depth of 2 µm to form trenches 14 and thereby define mesas with $t_m$=2 µm. Since the Ti and Ni layers on the mesa are the same width, the Ti contact is self-aligned to the trenches formed with the Ni layer as the etch mask. Turning to FIG. 5C, nickel is sputtered, or electron-beam blanket evaporated, into the trenches in the next step of the process to produce a continuous metal conformal to the trenches. The nickel may be covered with gold (Au) as desired to lower the resistivity of the metal, as shown in FIG. 5C. The device is then patterned by wet etching the Ni/Au to define the diode area, as shown in FIG. 5D. A contact is evaporated onto the back side of the heavily doped substrate, as shown in FIG. 5E. For an unannealed contact, a low barrier height metal such as Al or Ti may be used. Preferably, the contact is an annealed ohmic contact made of nickel and is formed on the back side of the substrate prior to the lithography step for the trench formation.

Figure 6A:
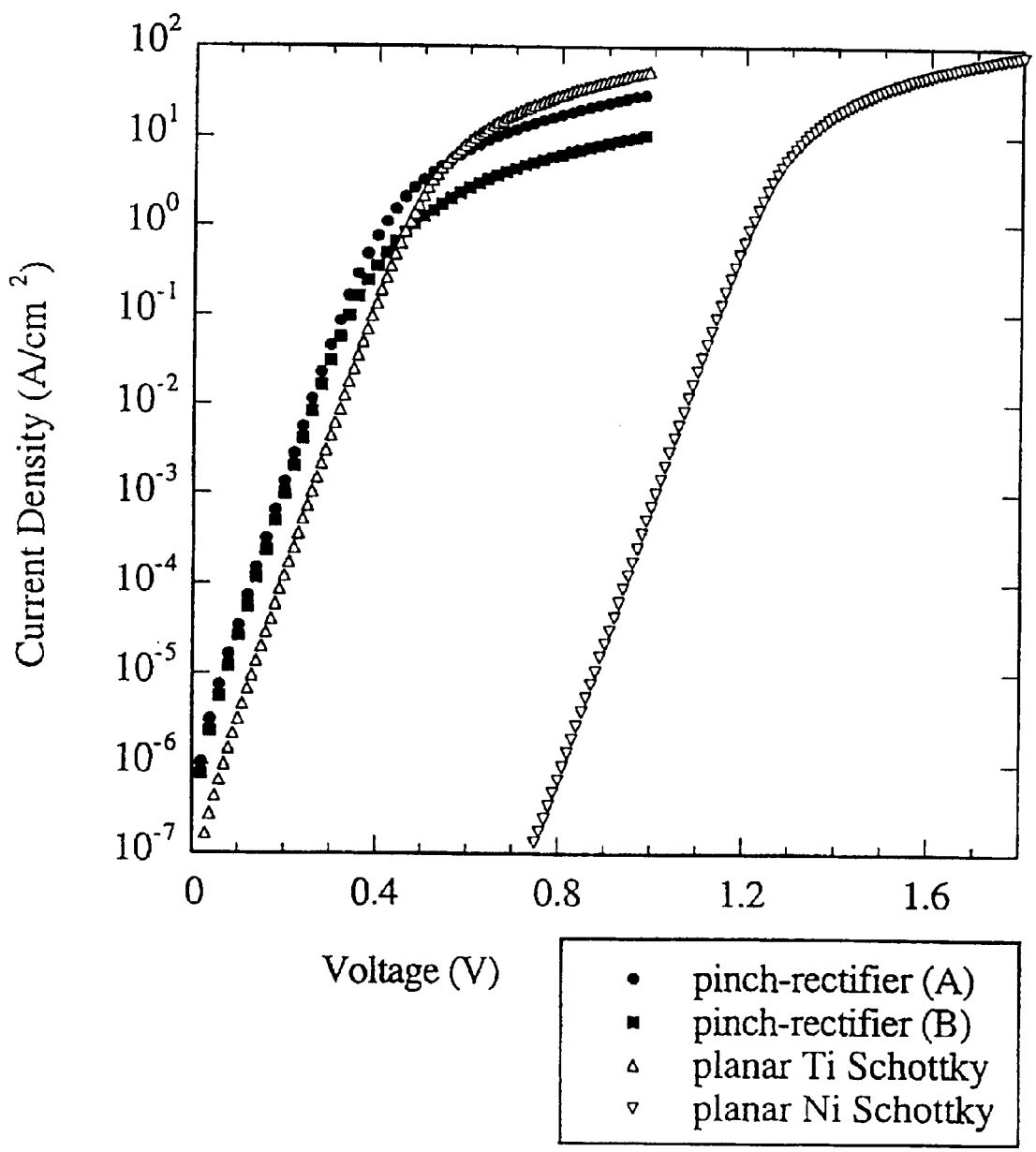
FIG. 6A is a plot of forward-bias current-voltage characteristics for two DMT SiC Schottky rectifiers according to the present invention and two planar SiC Schottky rectifiers.

The forward bias current-voltage (I-V) characteristics of Ti/Ni DMT SiC Schottky rectifiers fabricated as described above are shown in FIG. 6A along with the I-V characteristics of a planar Ti Schottky rectifier and a planar Ni Schottky rectifier for comparison purposes. Both the 2 µm (B) and 3 µm (A) Ti/Ni DMT devices show forward bias characteristics which are comparable to the planar Ti Schottky rectifier. The barrier height and the ideality factor of the Ti/Ni DMT devices are 0.8 eV and 1.06. Comparable barrier heights and ideality factors for the planar devices are as follows: 0.84 eV and 1.09 for planar Ti devices, and 1.51 eV and 1.11 for planar Ni devices. The 2 µm device structure shows a larger series resistance than the 3 µm device structure. This is expected since the percentage of the mesa which is not laterally depleted by the Ni contact at zero bias is smaller for the 2 µm sample than for the 3 µm sample.

Figure 6B:
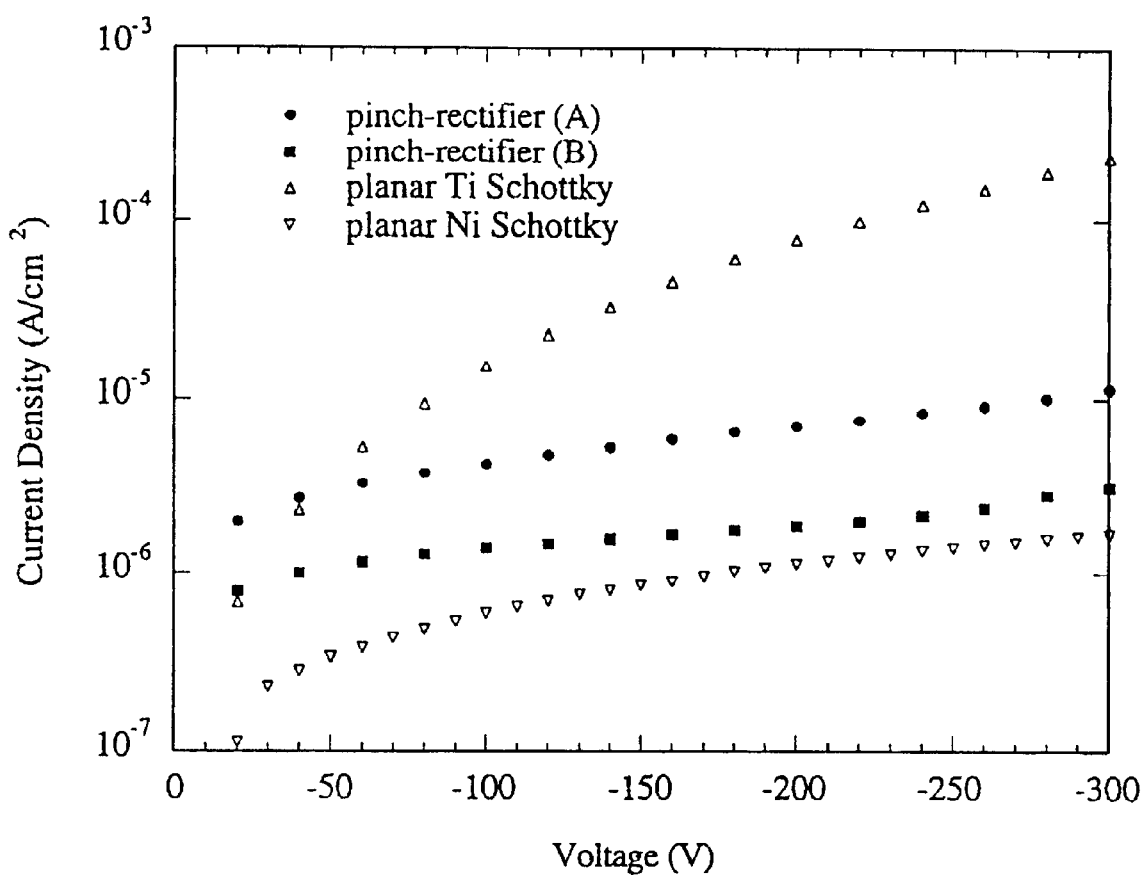
FIG. 6B is a plot of reverse-bias current-voltage characteristics for two DMT SiC Schottky pinch rectifiers according to the present invention and two planar SiC Schottky rectifiers.

The reverse bias I-V characteristics of the same Ti/Ni DMT Schottky rectifiers, planar Ti Schottky rectifier, and planar Ni Schottky rectifier are shown in FIG. 6B. The reverse I-V characteristics of both the 2 µm (B) and the 3 µm (A) Ti/Ni DMT Schottky rectifiers show a reduction in reverse leakage current when compared with the planar Ti Schottky rectifier. The reverse leakage currents of the 2 µm and 3 µm Ti/Ni DMT Schottky structures are approximately 75 times and 20 times less than the reverse leakage current of the planar Ti Schottky rectifier, respectively. The lower leakage current for the 2 µm structure is expected since that device structure provides better electric field shielding than the 3 µm device structure.

The breakdown voltage of the devices were experimentally found to be reduced from that of the planar device structure. The breakdown voltage of about 450 V correlates well with the trench corner field crowding predicted by MEDICI simulations and shown in FIG. 4C.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention. For example, while SiC is disclosed as the preferred material for the device and is particularly preferred over Si, which has a relatively small bandgap, e.g., 1.1 eV, other wide bandgap materials may be used, including diamond, which do not exhibit Fermi level pinning. 4HSiC is particularly preferred because it has a wide bandgap of approximately 3.2 eV, approximately three times that of Si. However, other polytypes of SiC may be used, such as 6H (bandgap of approximately 3.0 eV) and 3C (bandgap of approximately 2.5 eV), although 3C SiC must be grown on a substrate of different material.

What is claimed is:

1. A dual-metal-trench silicon carbide Schottky pinch rectifier, comprising:
    a silicon carbide substrate of a first conductivity type;
    a plurality of trenches formed in said silicon carbide substrate, said substrate defining a mesa between adjacent ones of said trenches;
    a first Schottky contact at the bottom of each trench, said first Schottky contact having a relatively high barrier height; and
    a second Schottky contact on each mesa, said second Schottky contact having a relatively low barrier height,
    wherein said first Schottky contact includes a first metal, said rectifier further comprising a layer of said first metal deposited over said second Schottky contact on said mesa.

2. The Schottky pinch rectifier of claim 1, wherein said first metal is conformal to the walls and bottom surfaces of said trenches.

3. A method of fabricating a silicon carbide Schottky rectifier, comprising:
    forming a bi-layer metal pattern on a silicon carbide substrate, said bi-layer metal pattern including a lower layer in contact with said silicon carbide substrate and an upper layer having the same length and width as said lower layer, wherein said lower layer is a metal having a relatively low barrier height and said upper layer is suitable as an etch mask;
    forming a pattern of trenches in said silicon carbide substrate by reactive ion etching with said upper layer of said bi-layer metal pattern as an etch mask, whereby said lower layer metal is self-aligned to the trenches;
    forming a metal layer in said trenches; and
    forming an ohmic contact on the bottom surface of said substrate.

4. The method of claim 3, wherein said upper layer is a metal having a relatively high barrier height.

5. The method of claim 4, wherein said step of forming a metal layer in said trenches is performed by sputter deposition, and wherein a continuous metal layer conformal to said trenches is thereby formed.

6. A dual-metal-trench Schottky pinch rectifier, comprising:
    a semiconductor substrate of a first conductivity type;
    a plurality of trenches formed in said semiconductor substrate, said substrate defining a mesa between adjacent ones of said trenches;
    a first Schottky contact at the bottom of each trench, said first Schottky contact having a relatively high barrier height and including a first metal;
    a second Schottky contact on each mesa, said second Schottky contact having a relatively low barrier height; and
    a layer of said first metal deposited over said second Schottky contact on said mesa.

7. The Schottky pinch rectifier of claim 6, wherein said first metal is conformal to the walls and bottom surfaces of said trenches.

8. A method of fabricating a dual-metal-trench Schottky rectifier, comprising:
    forming a bi-layer metal pattern on a semiconductor substrate, said bi-layer metal pattern including a lower layer in contact with said substrate and an upper layer having the same length and width as said lower layer, wherein said lower layer is a metal having a relatively low barrier height and said upper layer is suitable as an etch mask;

forming a pattern of trenches in said substrate by reactive ion etching with said upper layer of said bi-layer metal pattern as an etch mask, whereby said lower layer metal is self-aligned to the trenches;

forming a metal layer in said trenches; and forming an ohmic contact on the bottom surface of said substrate.

9. The method of claim 8, wherein said upper layer is a metal having a relatively high barrier height.

10. The method of claim 9, wherein said step of forming a metal layer in said trenches is performed by sputter deposition, and wherein a continuous metal layer conformal to said trenches is thereby formed.

* * * * *

UNITED STATES PATENT AND TRADEMARK OFFICE
CERTIFICATE OF CORRECTION

PATENT NO. : 6,362,495 B1
DATED : March 26, 2002
INVENTOR(S) : Kipp J. Schoen et al.

It is certified that error appears in the above-identified patent and that said Letters Patent is hereby corrected as shown below:

Column 4,
Line 55, please change "13 μum" to -- 13 μm --.

Signed and Sealed this

Twenty-first Day of January, 2003

JAMES E. ROGAN
*Director of the United States Patent and Trademark Office*